(12) United States Patent
Shingai et al.

(10) Patent No.: US 10,510,457 B2
(45) Date of Patent: Dec. 17, 2019

(54) TRANSPARENT CONDUCTOR

(71) Applicant: TDK CORPORATION, Tokyo (JP)

(72) Inventors: Hiroshi Shingai, Tokyo (JP); Yoshihisa Tamagawa, Tokyo (JP); Yoshihiko Tanabe, Tokyo (JP); Motohiro Sakurai, Tokyo (JP); Yoshinori Sato, Tokyo (JP)

(73) Assignee: TDK CORPORATION, Tokyo (JP)

( * ) Notice: Subject to any disclaimer, the term of this patent is extended or adjusted under 35 U.S.C. 154(b) by 123 days.

(21) Appl. No.: 15/577,161

(22) PCT Filed: Dec. 8, 2016

(86) PCT No.: PCT/JP2016/086602
§ 371 (c)(1),
(2) Date: Nov. 27, 2017

(87) PCT Pub. No.: WO2017/099187
PCT Pub. Date: Jun. 15, 2017

(65) Prior Publication Data
US 2018/0197649 A1 Jul. 12, 2018

(30) Foreign Application Priority Data

Dec. 11, 2015 (JP) ................. 2015-242522

(51) Int. Cl.
*B32B 15/04* (2006.01)
*B32B 17/06* (2006.01)
(Continued)

(52) U.S. Cl.
CPC ................. *H01B 1/02* (2013.01); *B32B 7/02* (2013.01); *B32B 9/04* (2013.01); *C23C 14/08* (2013.01);
(Continued)

(58) Field of Classification Search
USPC ................. 428/688, 697, 701, 702
See application file for complete search history.

(56) References Cited

U.S. PATENT DOCUMENTS 5,296,302 A * 3/1994 O'Shaughnessy ...... B32B 17/06
428/472
6,774,558 B2 8/2004 Otani et al.
(Continued)

FOREIGN PATENT DOCUMENTS

JP H09-291355 A 11/1997
JP 2001-328198 A 11/2001
(Continued)

OTHER PUBLICATIONS

Jan. 31, 2017 Search Report issued in International Application No. PCT/JP2016/086602.
(Continued)

*Primary Examiner* — Lauren R Colgan
(74) *Attorney, Agent, or Firm* — Oliff PLC

(57) ABSTRACT

The transparent conductor includes a transparent resin substrate, a first metal oxide layer, a metal layer containing a silver alloy, and a second metal oxide layer in the order presented. The first metal oxide layer contains zinc oxide, indium oxide, and titanium oxide, and the content of $SnO_2$ in the first metal oxide layer is 40 mol % or less with respect to the total of four components of zinc oxide, indium oxide, titanium oxide, and tin oxide in terms of ZnO, $In_2O_3$, $TiO_2$, and $SnO_2$, respectively. The second metal oxide layer contains the four components, and the content of $SnO_2$ in the second metal oxide layer is 12 to 40 mol % with respect to the total of the four components in terms of ZnO, $In_2O_3$, $TiO_2$, and $SnO_2$, respectively.

11 Claims, 3 Drawing Sheets

(51) Int. Cl.
  *H01B 1/02*    (2006.01)
  *H01B 5/14*    (2006.01)
  *C23C 14/14*   (2006.01)
  *B32B 7/02*    (2019.01)
  *B32B 9/04*    (2006.01)
  *C23C 14/08*   (2006.01)
  *H01B 1/08*    (2006.01)
  *H01B 3/10*    (2006.01)
  *G06F 3/041*   (2006.01)

(52) U.S. Cl.
  CPC ............ *C23C 14/086* (2013.01); *C23C 14/14* (2013.01); *H01B 1/08* (2013.01); *H01B 3/10* (2013.01); *H01B 5/14* (2013.01); *G06F 3/041* (2013.01)

(56) References Cited

U.S. PATENT DOCUMENTS

| | | |
|---|---|---|
| 2003/0012936 A1 | 1/2003 | Draheim et al. |
| 2004/0038051 A1* | 2/2004 | Fujisawa ............... C03C 17/245 428/469 |
| 2004/0209420 A1 | 10/2004 | Ljungcrantz et al. |
| 2008/0105302 A1 | 5/2008 | Lu et al. |
| 2008/0210303 A1 | 9/2008 | Lu et al. |
| 2008/0302414 A1 | 12/2008 | den Boer et al. |
| 2009/0315849 A1* | 12/2009 | Ito ............................ C08J 7/045 345/173 |
| 2011/0223433 A1 | 9/2011 | Hammond et al. |
| 2015/0205409 A1 | 7/2015 | Shingai et al. |
| 2016/0258694 A1 | 9/2016 | Mitsumoto et al. |
| 2017/0075044 A1 | 3/2017 | Watanabe et al. |
| 2018/0197649 A1 | 7/2018 | Shingai et al. |

FOREIGN PATENT DOCUMENTS

| | | |
|---|---|---|
| JP | 2001-328199 A | 11/2001 |
| JP | 2002-157929 A | 5/2002 |
| JP | 2012-135888 A | 7/2012 |
| JP | 2016-184533 A | 10/2016 |
| WO | 2014/167835 A1 | 10/2014 |
| WO | 2014/171149 A1 | 10/2014 |

OTHER PUBLICATIONS

Jun. 21, 2018 International Preliminary Report on Patentability issued in International Application No. PCT/JP2016/086602.
Jun. 10, 2019 Office Action issued in Chinese Patent Application No. 201680018090.4.
Jun. 14, 2016 International Search Report issued in International Patent Application No. PCT/JP2016/059600.
Oct. 26, 2018 Extended Search Report issued in European Patent Application No. 16768937.1.
Oct. 5, 2017 International Preliminary Report on Patentability issued in International Patent Application No. PCT/JP2016/059600.
U.S. Appl. No. 15/556,107, filed Sep. 6, 2017in the name of Shingai et al.
Mar. 8, 2019 Office Action issued in U.S. Appl. No. 15/556,107.

* cited by examiner

US 10,510,457 B2

TRANSPARENT CONDUCTOR

TECHNICAL FIELD

The present disclosure relates to a transparent conductor.

BACKGROUND ART

Transparent conductors are used for displays such as liquid crystal displays (LCDs), plasma display panels (PDPs), and electroluminescence panels (organic EL, inorganic EL), and transparent electrodes for solar cells or the like. In addition, transparent conductors are used for electromagnetic insulation films and infrared shield film. For a material of a metal oxide layer of a transparent conductor, ITO, which is a substance obtained by adding tin (Sn) to indium oxide ($In_2O_3$), is widely used.

Transparent conductors are required to be excellent not only in transparency but also in various properties according to the application. For a transparent conductor having conductivity superior to ITO, those with various materials have been examined. In Patent Literature 1, for example, a transparent conductive film having a laminate structure of a metal oxide layer containing indium oxide or zinc oxide as a primary component and a metal layer has been proposed.

CITATION LIST

Patent Literature

Patent Literature 1: Japanese Unexamined Patent Publication No. 2002-157929

SUMMARY OF INVENTION

Technical Problem

Transparent conductors having transparency and conductivity in combination are used for various applications. In use for a solar cell, an outdoor display, or a touch panel for automobile use, for example, a transparent conductor having excellent corrosion resistance even under a high temperature and high humidity environment is required. However, a transparent conductor including a metal layer and a pair of metal oxide layers sandwiching the metal layer may undergo corrosion due to migration of the metal layer after long-term use under a high temperature and high humidity environment. Thus, a technique to improve the corrosion resistance of a transparent conductor under a high temperature and high humidity environment has been required.

For such a transparent conductor, a conductive part and an insulating part are formed through performing a patterning process. To ensure the conduction of the conductive part, at least the metal oxide layer provided apart from a transparent resin substrate is required to have good conductivity.

In view of this, an object of the present invention is to provide a transparent conductor having excellent transparency and excellent conductivity in combination, and being excellent in corrosion resistance under a high temperature and high humidity environment.

Solution to Problem

The present invention provides, in one aspect, a transparent conductor comprising a transparent resin substrate, a first metal oxide layer, a metal layer containing a silver alloy, and a second metal oxide layer in the order presented, wherein the first metal oxide layer contains zinc oxide, indium oxide, and titanium oxide, and the content of $SnO_2$ in the first metal oxide layer is 40 mol % or less with respect to the total of four components of zinc oxide, indium oxide, titanium oxide, and tin oxide in terms of ZnO, $In_2O_3$, $TiO_2$, and $SnO_2$, respectively, and the second metal oxide layer contains zinc oxide, indium oxide, titanium oxide, and tin oxide, and the content of $SnO_2$ in the second metal oxide layer is 12 to 40 mol % with respect to the total of the four components in terms of ZnO, $In_2O_3$, $TiO_2$, and $SnO_2$, respectively.

The second metal oxide layer of the transparent conductor contains zinc oxide, indium oxide, titanium oxide, and tin oxide. The configuration in which the four components are contained and the content of $SnO_2$ is in the predetermined range provides excellent transparency and excellent conductivity in combination. Accordingly, the second metal oxide layer suitably allows formation of a conductor part of the transparent conductor. The first metal oxide layer contains zinc oxide, indium oxide, and titanium oxide, and the content of $SnO_2$ in the first metal oxide layer is the predetermined value or less. For this reason, the first metal oxide layer has high transparency.

Further, the configuration in which the content of $SnO_2$ in each of the first metal oxide layer and the second metal oxide layer is the corresponding predetermined value or less can enhance the corrosion resistance of the metal layer containing a silver alloy under an environment with high temperature and high humidity (under a high temperature and high humidity environment). Although the reason why such effect can be obtained is not necessarily clear, it is expected that the configuration in which the predetermined components are contained and the content of tin oxide is set low prevents degradation of the first metal oxide layer and the second metal oxide layer to reduce the amount of water vapor to transmit therethrough, or that the diffusion of a degraded component from the first metal oxide layer and the second metal oxide layer to the metal layer can be reduced. Presumably because of this, the occurrence of the migration or the like of the metal layer containing a silver alloy is prevented. However, the mechanism for prevention of degradation of the metal layer is not limited thereto. Thus, the transparent conductor has excellent transparency and excellent conductivity in combination, and is excellent in corrosion resistance under a high temperature and high humidity environment.

In the second metal oxide layer, the content of ZnO may be 20 to 50 mol %, the content of $In_2O_3$ may be 20 to 35 mol %, and the content of $TiO_2$ may be 10 to 15 mol %, with respect to the total of the four components. In the first metal oxide layer, the content of ZnO may be 20 to 80 mol %, the content of $In_2O_3$ may be 10 to 35 mol %, and the content of $TiO_2$ may be 5 to 15 mol %, with respect to the total of the four components. The transparent conductor in which the second metal oxide layer has the above composition is excellent in etching properties and resistance to alkalis with all the properties of transparency, conductivity, and corrosion resistance kept at an even higher level. The transparent conductor in which the first metal oxide layer has the above composition is excellent in etching properties and resistance to alkalis with the transparency and corrosion resistance kept at an even higher level.

In the first metal oxide layer, the content of $SnO_2$ may be 5 mol % or less with respect to the total of the four components. The first metal oxide layer is provided in the transparent resin substrate side beyond the second metal oxide layer. The transparent resin substrate allows more water vapor to transmit than a glass sheet. For this reason, the configuration in which the content of $SnO_2$ in the first metal oxide layer is set low to reduce the influence of water vapor can impart even higher corrosion resistance under a high temperature and high humidity environment to the transparent conductor.

Although the configuration in which $SnO_2$ in the predetermined quantity is contained allows the transparent conductor to keep the conductivity, the first metal oxide layer is not required to have conductivity. Thus, the corrosion resistance of the silver alloy under a high temperature and high humidity environment can be further enhanced by setting the content of $SnO_2$ low to reduce the reactivity with the silver alloy contained in the metal layer.

At least one of the first metal oxide layer and the second metal oxide layer may be amorphous. Thereby, the transmission of water vapor through the first metal oxide layer and the second metal oxide layer is sufficiently prevented, and thus degradation such as the migration of the metal layer can be further prevented. Thereby, the corrosion resistance of the transparent conductor can be further enhanced.

The silver alloy in the metal layer may contain Ag, Pd, and Cu as constituent elements. Thereby, degradation such as the migration of the metal layer is further prevented, and thus the corrosion resistance of the transparent conductor can be further enhanced.

Advantageous Effects of Invention

The present invention can provide a transparent conductor having excellent transparency and excellent conductivity in combination, and being excellent in corrosion resistance under a high temperature and high humidity environment.

DESCRIPTION OF EMBODIMENTS

Figure 1:
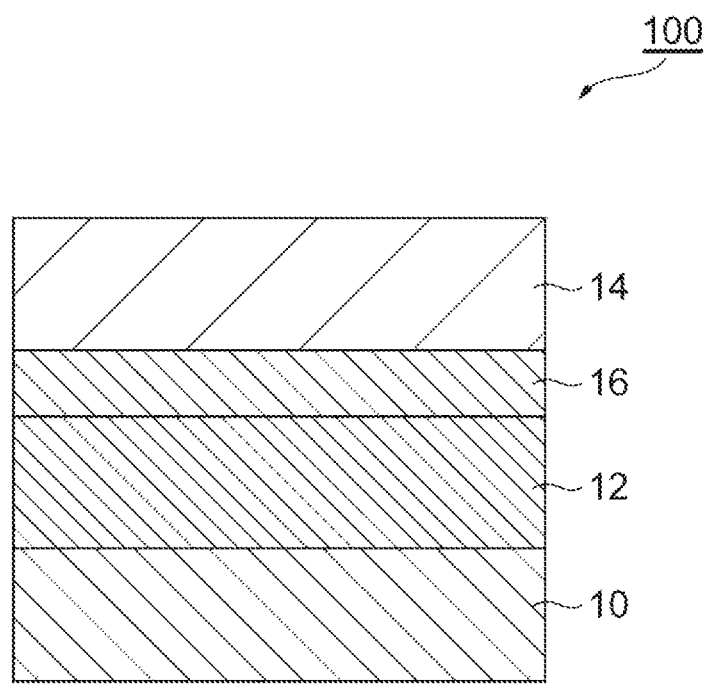
FIG. 1 is a cross-sectional view schematically illustrating one embodiment of the transparent conductor.

Embodiments of the present invention will be described in detail below with reference to drawings. However, the embodiments below are examples to describe the present invention, and are not intended to limit the present invention to the contents below. In descriptions, an identical reference sign is used for identical elements or elements having identical function, and redundant descriptions are occasionally omitted. The positional relation such as right and left and up and down in a drawing is as illustrated in the drawing, unless otherwise specified. In addition, the dimensional ratio in a drawing is not limited to that illustrated in the drawing.

FIG. 1 is a schematic cross-sectional view illustrating one embodiment of the transparent conductor. A transparent conductor 100 has a laminate structure in which a film-shaped transparent resin substrate 10, a first metal oxide layer 12, a metal layer 16, and a second metal oxide layer 14 are disposed in the order presented.

"Transparent" in the present specification means that visible lights transmit, and a certain degree of light scattering is permitted. The degree of light scattering required for the transparent conductor 100 depends on the application thereof. What is called "semitransparent", which allows light scattering, is also included in the concept of "transparent" in the present specification. It is preferable that the degree of light scattering be smaller and the transparency be higher. The total light transmittance of the transparent conductor 100 is, for example, 84% or higher, preferably 86% or higher, and more preferably 88% or higher. The total light transmittance is transmittance for light including diffused transmitted light and determined by using an integrating sphere, and measured by using a commercially available hazemeter.

The transparent resin substrate 10 may be any flexible organic resin film, without any limitation. The organic resin film may be an organic resin sheet. Examples of the organic resin film include polyester films such as polyethylene terephthalate (PET) films and polyethylene naphthalate (PEN) films; polyolefin films such as polyethylene films and polypropylene films; polycarbonate films; acrylic films; norbornene films; polyarylate films; polyether sulfone films; diacetylcellulose films; and triacetylcellulose films. Among them, polyester films such as polyethylene terephthalate (PET) films and polyethylene naphthalate (PEN) films are preferable.

It is preferable that the transparent resin substrate 10 be thicker, from the viewpoint of rigidity. On the other hand, it is preferable that the transparent resin substrate 10 be thinner, from the viewpoint of thinning of the transparent conductor 100. From such viewpoints, the thickness of the transparent resin substrate 10 is, for example, 10 to 200 µm. The refractive index of the transparent resin substrate is, for example, 1.50 to 1.70, from the viewpoint of achieving a transparent conductor excellent in optical properties. The refractive index in the present specification is a value measured under conditions of $\lambda=633$ nm and a temperature of 20° C.

The transparent resin substrate 10 may have been subjected to at least one surface treatment selected from the group consisting of corona discharge treatment, glow discharge treatment, flame treatment, ultraviolet irradiation treatment, electron beam irradiation treatment, and ozone treatment. The transparent resin substrate may be a resin film. While resin films typically allow the transmission of water vapor or the like, the transparent conductor 100 is excellent in corrosion resistance. Accordingly, the original performance can be maintained even when a resin film is used. The configuration in which a resin film is used can impart excellent flexibility to the transparent conductor 100. Thereby, the transparent conductor 100 can be more suitably used for a transparent conductor for touch panels, transparent electrodes for organic devices such as flexible organic EL lights, and electromagnetic shielding.

The first metal oxide layer 12 is a transparent layer containing oxides, and contains three components of zinc oxide, indium oxide, and titanium oxide as primary components. In some embodiments, four components consisting of the three components plus tin oxide may be contained as primary components. However, containing tin oxide is not essential, and tin oxide is not required to be contained.

The zinc oxide is, for example, ZnO, and the indium oxide is, for example $In_2O_3$. The titanium oxide is, for example, $TiO_2$, and the tin oxide is, for example, $SnO_2$. The ratio of metal atoms to oxygen atoms in each metal oxide may be deviated from the stoichiometric ratio. Another oxide with a different oxidation number may be contained.

In the first metal oxide layer 12, the content of $SnO_2$ is 40 mol % or less with respect to the total of ZnO, $In_2O_3$, $TiO_2$, and $SnO_2$ as zinc oxide, indium oxide, titanium oxide, and tin oxide are converted into ZnO, $In_2O_3$, $TiO_2$, and $SnO_2$, respectively. Thus, the configuration in which the content of $SnO_2$ is set low can prevent the corrosion of the metal layer 16 under a high temperature and high humidity environment. This is presumably because reaction of Sn in the first metal oxide layer 12 and the silver alloy in the metal layer 16 can be suppressed. However, the mechanism for prevention of the corrosion is not limited thereto.

From the viewpoint of further prevention of the migration of the metal layer 16 under a high temperature and high humidity environment, the content of $SnO_2$ is preferably 20 mol % or less, and more preferably 5 mol % or less. If the content of $SnO_2$ is lower, the conductivity of the first metal oxide layer 12 tends to be lower. However, the conductivity of the transparent conductor 100 may be controlled by the metal layer 16 and the second metal oxide layer 14. The conductivity of the second metal oxide layer 14 can be enhanced by setting the content of tin oxide in the second metal oxide layer 14 higher than that in the first metal oxide layer 12. Thus, the first metal oxide layer 12 may have low conductivity, or may be an insulator.

The contents of the three components, except tin oxide, in the first metal oxide layer 12 are not limited in any way. In some embodiments, each of the contents of the three components may be in the following range. Specifically, from the viewpoint of achieving excellent transparency and excellent conductivity in combination, the content of zinc oxide is preferably 20 to 80 mol %, and more preferably 21 to 77 mol %, as with the case of the content of tin oxide, in terms of the corresponding oxide ZnO. From the viewpoint of achieving excellent transparency, high conductivity, and high corrosion resistance in combination, the content of indium oxide is preferably 10 to, 35 mol %, and more preferably 13 to 30 mol %, as with the case of the content of tin oxide, in terms of the corresponding oxide $In_2O_3$. From the viewpoint of achieving high transparency and excellent corrosion resistance in combination, the content of titanium oxide is preferably 5 to 15 mol %, and more preferably 9 to 13 mol %, as with the case of the content of tin oxide, in terms of the corresponding oxide $TiO_2$.

The first metal oxide layer 12 has a function to adjust optical properties, and a function to protect the metal layer 16, in combination. The first metal oxide layer 12 may contain, in addition to the four components, any trace component or inevitable component in a quantity such that the functions of the first metal oxide layer 12 are not largely impaired. However, it is preferable that the fraction of the total of the primary components in the first metal oxide layer 12 be high, from the viewpoint of imparting sufficiently high properties to the transparent conductor 100. In this case, the fraction is, for example, 95 mol % or more, and preferably 97 mol % or more. The first metal oxide layer 12 may consist of the three components or the four components.

It is preferable that the first metal oxide layer 12 and the second metal oxide layer 14 be amorphous. Thereby, the transmission of water vapor through the first metal oxide layer 12 and the second metal oxide layer 14 can be further prevented. The first metal oxide layer 12 can be amorphized through adjustment of the composition of the four components or the three components. The second metal oxide layer 14 can be amorphized through adjustment of the composition of the four components.

The second metal oxide layer 14 is a transparent layer containing an oxide, and contains four components of zinc oxide, indium oxide, titanium oxide, and tin oxide, as primary components. The configuration in which the second metal oxide layer 14 contains the four components as primary components allows the second metal oxide layer 14 to have excellent conductivity and excellent transparency in combination. The zinc oxide is, for example, ZnO, the indium oxide is, for example, $In_2O_3$, the titanium oxide is, for example, $TiO_2$, and the tin oxide is, for example, $SnO_2$. The ratio of metal atoms to oxygen atoms in each metal oxide may be deviated from the stoichiometric ratio. The ratio of metal atoms to oxygen atoms in each metal oxide may be deviated from the stoichiometric ratio. Another oxide with a different oxidation number may be contained.

In the second metal oxide layer 14, the content of $SnO_2$ is 12 to 40 mol % with respect to the total of ZnO, $In_2O_3$, $TiO_2$, and $SnO_2$ as zinc oxide, indium oxide, titanium oxide, and tin oxide are converted into ZnO, $In_2O_3$, $TiO_2$, and $SnO_2$, respectively. The configuration in which the content of $SnO_2$ is in the range allows achievement of high conductivity and excellent corrosion resistance under a high temperature and high humidity environment in combination. It is preferable that the content of $SnO_2$ be 16 to 38 mol %. If the content of $SnO_2$ is excessively high, the transparency and the corrosion resistance of the silver alloy under a high temperature and high humidity environment tend to be impaired. In addition, a large content of $SnO_2$ is likely to result in poor dissolution in acids to complicate etching. If the content of $SnO_2$ is excessively low, on the other hand, the excellent conductivity tends to be impaired.

In the second metal oxide layer 14, the contents of the four components, except tin oxide, are not limited in any way. In some embodiments, each of the contents of the four components may be in the following range. Specifically, from the viewpoint of achieving excellent transparency and excellent conductivity in combination, the content of zinc oxide is preferably 20 to 50 mol %, and more preferably 21 to 44 mol %, as with the case of the content of tin oxide, in terms of the corresponding oxide ZnO. From the viewpoint of achieving excellent transparency and high conductivity in combination, the content of indium oxide is preferably 20 to 35 mol %, and more preferably 26 to 30 mol %, as with the case of the content of tin oxide, in terms of the corresponding oxide $In_2O_3$. From the viewpoint of achieving high transparency and excellent corrosion resistance in combination, the content of titanium oxide is preferably 10 to 15 mol %, and more preferably 11 to 13 mol %, as with the case of the content of tin oxide, in terms of the corresponding oxide $TiO_2$.

The second metal oxide layer 14 has a function to adjust optical properties, a function to protect the metal layer 16, and a function to ensure the conductivity, etching properties, and resistance to alkalis in combination. The second metal oxide layer 14 may contain, in addition to the four components, any trace component or inevitable component in a quantity such that the functions of the second metal oxide layer 14 are not largely impaired. However, it is preferable that the fraction of the total of the primary components in the second metal oxide layer 14 be high, from the viewpoint of imparting sufficiently high properties to the transparent conductor 100. In this case, the fraction is, for example, 95 mol % or more, and preferably 97 mol % or more. The second metal oxide layer 14 may consist of the four components.

The first metal oxide layer 12 and the second metal oxide layer 14 may be identical or different in thickness, structure, and composition. The configuration in which the composition of the first metal oxide layer 12 is set different from the composition of the second metal oxide layer 14 allows removal of only the second metal oxide layer 14 and the metal layer 16 by etching in a single operation with the first metal oxide layer 12 remaining without any change.

The thickness of each of the first metal oxide layer 12 and the second metal oxide layer 14 is, for example, 80 nm or smaller, from the viewpoint of further enhancement of the transparency. From the viewpoint of further enhancement of the corrosion resistance and enhancement of the productivity, on the other hand, the thickness is, for example, 20 nm or larger.

Each of the first metal oxide layer 12 and the second metal oxide layer 14 can be produced by using a vacuum film formation method such as a vacuum deposition method, a sputtering method, an ion plating method, and a CVD method. Among them, a sputtering method is preferable because a smaller film-forming chamber can be used and the film-forming speed is high in a sputtering method. Examples of the sputtering method include DC magnetron sputtering. For the target, an oxide target or a metal or metalloid target can be used.

A wiring electrode or the like may be provided on the second metal oxide layer 14. A current to conduct through the metal layer 16, which will be described later, is introduced from a wiring electrode or the like to be provided on the second metal oxide layer 14 to another wiring electrode or the like to be provided on the second metal oxide layer 14 via the second metal oxide layer 14. Accordingly, it is preferable that the second metal oxide layer 14 have high conductivity. From such a viewpoint, for example, it is preferable that the surface resistance value of the second metal oxide layer 14 as a single film be $1.0 \times 10^{+7}$ Ω/sq. or lower, and it is more preferable that the surface resistance value of the second metal oxide layer 14 as a single film be $5.0 \times 10^{+6}$ Ω/sq. or lower.

The metal layer 16 is a layer containing a silver alloy as a primary component. The configuration in which the metal layer 16 has high transparency and conductivity allows the transparent conductor 100 to have sufficiently low surface resistance with the total light transmittance kept sufficiently high. The constituent elements of the silver alloy are, for example, Ag and at least one selected from the group consisting of Pd, Cu, Nd, In, Sn, and Sb. Examples of the silver alloy include Ag—Pd, Ag—Cu, Ag—Pd—Cu, Ag—Nd—Cu, Ag—In—Sn, and Ag—Sn—Sb.

The content of the metals other than silver is, for example, 0.5 to 5% by mass with respect to the metal layer 16, from the viewpoint of further enhancement of the corrosion resistance and transparency. It is preferable that the silver alloy contain Pd as a metal other than silver. Thereby, the corrosion resistance under a high temperature and high humidity environment can be further enhanced. The content of Pd in the silver alloy may be, for example, 1% by mass or more.

The thickness of the metal layer 16 is, for example, 1 to 30 nm. From the viewpoint of sufficient enhancement of the total light transmittance of the transparent conductor 100 with the water vapor transmission rate kept sufficiently low, the thickness of the metal layer 16 is preferably 4 to 20 nm. If the thickness of the metal layer 16 is excessively small, the continuity of the metal layer 16 is impaired and an island structure is likely to be formed, and thus the total light transmittance tends to be lower and the surface resistance tends to be higher. If the thickness of the metal layer 16 is excessively large, on the other hand, the total light transmittance tends to be lower.

The metal layer 16 has a function to adjust the total light transmittance and surface resistance of the transparent conductor 100. The metal layer 16 can be produced by using a vacuum film formation method such as a vacuum deposition method, a sputtering method, an ion plating method, and a CVD method. Among them, a sputtering method is preferable because a smaller film-forming chamber can be used and the film-forming speed is high in a sputtering method. Examples of the sputtering method include DC magnetron sputtering. For the target, a metal target can be used.

It is preferable that the transparent conductor 100 have a low water vapor transmission rate. The water vapor transmission rate (WVTR) of the transparent conductor 100 may be, for example, $5 \times 10^{-3}$ g/m$^2$/day or lower, or may be $5 \times 10^{-4}$ g/m$^2$/day or lower. The configuration in which the transparent conductor 100 has such a low water vapor transmission rate can block water vapor, and thus the transparent conductor 100 can be suitably used particularly as a transparent electrode for organic devices. The water vapor transmission rate (WVTR) in the present specification is a value obtained from measurement by using a commercially available measurement apparatus such as a water vapor transmission rate measurement apparatus by a MOCON method (AQUATRAN) manufactured by Hitachi High-Technologies Corporation.

At least a part of the second metal oxide layer 14 and at least a part of the metal layer 16 in the transparent conductor 100 may be removed by etching or the like. In this case, a conductor pattern is formed by the metal layer 16 and the second metal oxide layer 14. In addition, at least a part of the first metal oxide layer 12 may be removed by etching or the like.

Figure 2:
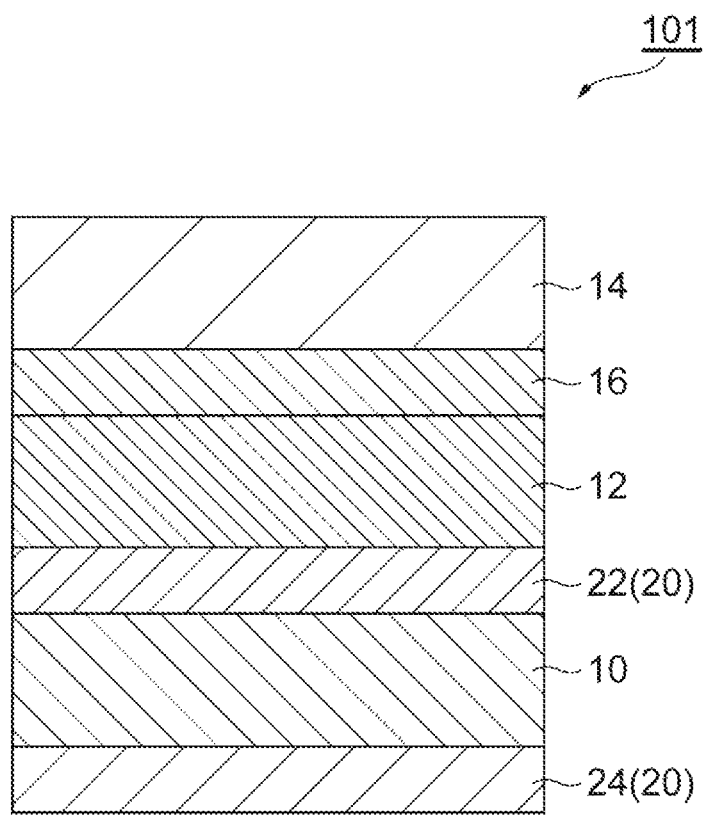
FIG. 2 is a cross-sectional view schematically illustrating another embodiment of the transparent conductor.

FIG. 2 is a schematic cross-sectional view illustrating another embodiment of the transparent conductor. A transparent conductor 101 differs from the transparent conductor 100 in that the transparent conductor 101 includes a pair of hardcoat layers 20 sandwiching the transparent resin substrate 10. The other constituents are the same as those of the transparent conductor 100.

The transparent conductor 101 includes, as a pair of hardcoat layers 20, a first hardcoat layer 22 on the main surface of the transparent resin substrate 10 in the first metal oxide layer 12 side, and a second hardcoat layer 24 on the main surface of the transparent resin substrate 10 in the side opposite to the first metal oxide layer 12 side. That is, the transparent conductor 101 has a laminate structure in which the second hardcoat layer 24, the transparent resin substrate 10, the first hardcoat layer 22, the first metal oxide layer 12, the metal layer 16, and the second metal oxide layer 14 are laminated in the order presented. The first hardcoat layer 22 and the second hardcoat layer 24 may be identical or different in thickness, structure, and composition. It is not necessary that both of the first hardcoat layer 22 and the second hardcoat layer 24 are included, and only one of them may be included.

The configuration in which the hardcoat layers 20 are provided can sufficiently prevent generation of a scratch in the transparent resin substrate 10. Each of the hardcoat layers 20 contains a cured resin obtained by curing a resin composition. It is preferable that the resin composition contain at least one selected from the group consisting of thermosetting resin compositions, ultraviolet-curable resin compositions, and electron beam-curable resin compositions. The thermosetting resin composition may contain at least one selected from the group consisting of epoxy resins, phenoxy resins, and melamine resins.

The resin composition is, for example, a composition containing a curable compound having an energy ray-reactive group such as a (meth)acryloyl group and a vinyl group. The representation "(meth)acryloyl group" means that at least one of an acryloyl group and a methacryloyl group is included. It is preferable that the curable compound contain a polyfunctional monomer or oligomer including two or more, preferably three or more, energy ray-reactive groups in one molecule.

The curable compound preferably contains an acrylic monomer. Specific examples of the acrylic monomer include 1,6-hexanediol di(meth)acrylate, triethylene glycol di(meth)acrylate, ethylene oxide-modified bisphenol A di(meth)acrylate, trimethylolpropane tri(meth)acrylate, trimethylolpropane ethylene oxide-modified tri(meth)acrylate, trimethylolpropane propylene oxide-modified tri(meth)acrylate, pentaerythritol tetra(meth)acrylate, ditrimethylol propane tetra(meth)acrylate, dipentaerythritol penta(meth)acrylate, dipentaerythritol hexa(meth)acrylate, pentaerythritol tri(meth)acrylate, and 3-(meth)acryloyloxy glycerin mono (meth)acrylate. However, the acrylic monomer is not necessarily limited to them. Other examples of the acrylic monomer include urethane-modified acrylates and epoxy-modified acrylates.

For the curable compound, a compound having a vinyl group may be used. Examples of the compound having a vinyl group include ethylene glycol divinyl ether, pentaerythritol divinyl ether, 1,6-hexanediol divinyl ether, trimethylolpropane divinyl ether, ethylene oxide-modified hydroquinone divinyl ether, ethylene oxide-modified bisphenol A divinyl ether, pentaerythritol trivinyl ether, dipentaerythritol hexavinyl ether, and ditrimethylol propane polyvinyl ether. However, the compound having a vinyl group is not necessarily limited to them.

In the case that the curable compound is cured with an ultraviolet ray, the resin composition contains a photopolymerization initiator. Various photopolymerization initiators can be used. For example, the photopolymerization initiator can be appropriately selected from known compounds including acetophenone-based, benzoin-based, benzophenone-based, and thioxanthone-based compounds. More specific examples of the photopolymerization initiator include DAROCUR 1173, IRGACURE 651, IRGACURE 184, IRGACURE 907 (trade names, manufactured by Ciba Specialty Chemicals Inc.), and KAYACURE DETX-S (trade name, manufactured by Nippon Kayaku Co., Ltd.).

The content of the photopolymerization initiator can be about 0.01 to 20% by mass or 0.5 to 5% by mass with respect to the mass of the curable compound. The resin composition may be a known resin composition obtained by adding a photopolymerization initiator to an acrylic monomer. Examples of the resin composition obtained by adding a photopolymerization initiator to an acrylic monomer include SD-318 (trade name, manufactured by Dainippon Ink and Chemicals) and XNR 5535 (trade name, manufactured by NAGASE & CO., LTD.), each as an ultraviolet-curable resin.

The resin composition may contain an organic fine particle and/or inorganic fine particle, for example, to enhance the strength of the coating film and/or adjust the refractive index. Examples of the organic fine particle include organic silicon fine particles, crosslinked acrylic fine particles, and crosslinked polystyrene fine particles. Examples of the inorganic fine particle include silicon oxide fine particles, aluminum oxide fine particles, zirconium oxide fine particles, titanium oxide fine particles, and iron oxide fine particles. Among them, silicon oxide fine particles are preferable.

Also preferable is a fine particle the surface of which has been treated with a silane coupling agent and includes energy ray-reactive groups including a (meth)acryloyl group and/or vinyl group present as a film thereon. Use of such a reactive fine particle can enhance the strength of the film through interparticle reaction of the fine particle or reaction between the fine particle and a polyfunctional monomer or oligomer during energy ray irradiation. A silicon oxide fine particle treated with a silane coupling agent containing a (meth)acryloyl group is preferably used.

The average particle diameter of the fine particle is smaller than the thickness of each of the hardcoat layers 20, and may be 100 nm or smaller, or 20 nm or smaller, from the viewpoint of ensuring sufficient transparency. From the viewpoint of production of a colloidal solution, on the other hand, the average particle diameter of the fine particle may be 5 nm or larger, or 10 nm or larger. In the case that an organic fine particle and/or inorganic fine particle is used, the total quantity of the organic fine particle and inorganic fine particle may be, for example, 5 to 500 parts by mass, or 20 to 200 parts by mass, with respect to 100 parts by mass of the curable compound.

If an energy ray-curable resin composition is used, the resin composition can be cured through irradiation with an energy ray such as an ultraviolet ray. Thus, use of such a resin composition is preferable from the viewpoint of the manufacture process.

The first hardcoat layer 22 can be produced by applying a solution or dispersion of a resin composition onto one surface of the transparent resin substrate 10 followed by drying to cure the resin composition. The application can be performed by using a known method. Examples of the application method include an extrusion nozzle method, a blade method, a knife method, a bar-coating method, a kiss-coating method, a kiss reverse method, a gravure roll method, a dipping method, a reverse roll method, a direct roll method, a curtain method, and a squeezing method. The second hardcoat layer 24 can be produced on the other surface of the transparent resin substrate 10 in the same manner as production of the first hardcoat layer 22.

The thickness of each of the first hardcoat layer 22 and the second hardcoat layer 24 is, for example, 0.5 to 10 μm. If the thickness is larger than 10 μm, unevenness in thickness or a wrinkle is likely to be generated. If the thickness is lower than 0.5 μm, on the other hand, in the case that quite a large quantity of low-molecular-weight components including a plasticizer or an oligomer is contained in the transparent resin substrate 10, it may be difficult to sufficiently prevent the bleed-out of the components. From the viewpoint of prevention of warpage, it is preferable that the thickness of the first hardcoat layer 22 be almost the same as that of the second hardcoat layer 24.

The refractive index of each of the first hardcoat layer 22 and the second hardcoat layer 24 is, for example, 1.40 to 1.60. It is preferable that the absolute value of the refractive index difference between the transparent resin substrate 10 and the first hardcoat layer 22 be 0.1 or less. It is preferable that the absolute value of the refractive index difference between the transparent resin substrate 10 and the second hardcoat layer 24 be also 0.1 or less. The configuration in which the absolute value of the refractive index difference between each of the first hardcoat layer 22 and the second hardcoat layer 24 and the transparent resin substrate 10 is small can reduce the intensity of interference unevenness generated by unevenness in thickness in the first hardcoat layer 22 and the second hardcoat layer 24.

The thickness of each layer constituting the transparent conductor 100 or 101 can be measured by using the following procedure. The transparent conductor 100 or 101 is cut with a focused ion beam (FIB) apparatus to obtain a cross-section. The cross-section is observed under a transmission electron microscope (TEM) to measure the thickness of each layer. It is preferable to measure at 10 or more positions arbitrarily selected to determine the average value. To obtain a cross-section, a microtome may be used as an apparatus other than a focused ion beam apparatus. For measurement of thickness, a scanning electron microscope (SEM) may be used. Alternatively, measurement of film thickness can be performed by using an X-ray fluorescence spectrometer.

The thickness of the transparent conductor 100 or 101 may be 300 μm or smaller, or may be 250 μm or smaller. Such a thickness can sufficiently meet the required level of thinning. The total light transmittance of the transparent conductor 100 or 101 can be, for example, as high as 84% or higher. The surface resistance value (four-terminal method) of the transparent conductor 100 or 101 can be controlled to, for example, 30 Ω/sq. or lower, or can be controlled even to 25 Ω/sq. or lower, even without thermal annealing of the first metal oxide layer 12 and the second metal oxide layer 14.

Each of the transparent conductors 100 and 101 having the above-described configurations has a laminate structure in which the first metal oxide layer 12, the metal layer 16, and the second metal oxide layer 14 are laminated. This laminate structure can be easily removed in a single operation with a common etching solution (acid). In addition, the laminate structure is excellent in resistance to alkalis. Accordingly, the laminate structure enables efficient formation of a pattern. In addition, each of the transparent conductors 100 and 101 has a high transmittance and has a high conductivity, even without performing thermal annealing.

The transparent conductors 100 and 101 can be used for touch panels. However, the application is not limited to touch panels.

Figure 3:
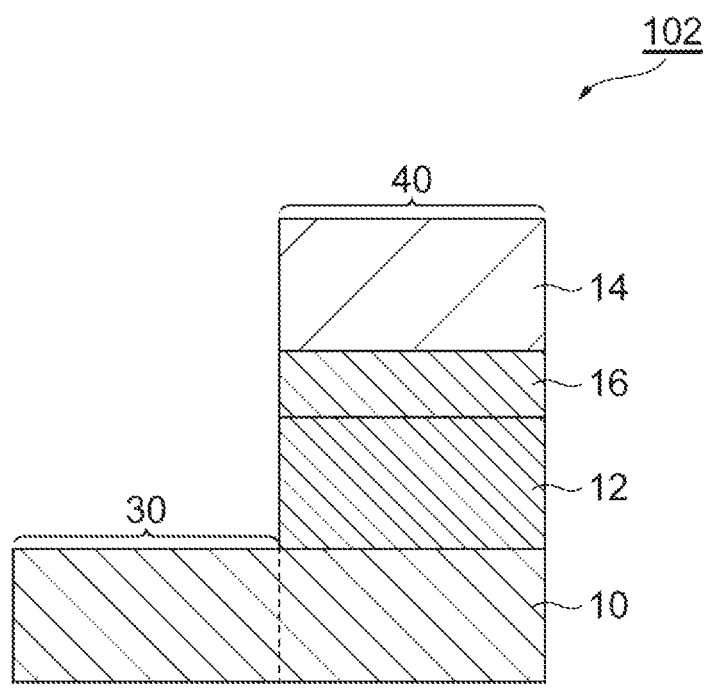
FIG. 3 is a cross-sectional view schematically illustrating still another embodiment of the transparent conductor.

FIG. 3 is a cross-sectional view schematically illustrating still another embodiment of the transparent conductor. A transparent conductor 102 includes a conductive part 40 including the transparent resin substrate 10, the first metal oxide layer 12, the metal layer 16, and the second metal oxide layer 14 in the order presented, and a nonconductive part 30 including only the transparent resin substrate 10, without any of the first metal oxide layer 12, the second metal oxide layer 14, and the metal layer 16. The transparent conductor 102 can be obtained by removing the first metal oxide layer 12, and the second metal oxide layer 14 and the metal layer 16 in the transparent conductor 100 in FIG. 1 through etching. The conductive part 40 constitutes a conductive pattern.

The transparent conductor 102 having a conductive pattern of a predetermined shape can be used for transparent electrodes, prevention of electrostatic charging, and electromagnetic shielding in various display devices including organic devices such as organic EL displays, organic EL lights, and organic thin-film solar cells, light control films, and electronic papers.

It is preferable that the surface resistance value of the transparent conductor in the above applications be approximately 30 Ω/sq. or lower. While ITO films with a thickness of 100 nm or larger have been conventionally used as transparent electrodes, it has been difficult to set the surface resistance sufficiently low on a resin substrate. However, the transparent conductors 100, 101, and 102 can achieve surface resistance lower than that of ITO having the above thickness, and each can be suitably used as a transparent electrode for applications requiring low surface resistance on a resin substrate. In addition, the transparent conductors 100, 101, and 102 can be used for liquid crystal screens and antennas.

In the case that the transparent conductor 100, 101, or 102 is used for an organic device, the transparent conductor 100, 101, or 102 is used as a positive electrode of the organic device. An organic layer, a reflective electrode (negative electrode), and a sealing film are provided on the second metal oxide layer 14 after being patterned, in the order presented from the second metal oxide layer 14 side. Although the organic layer is easily degraded by moisture, the lifetime of the organic device can be extended by using the transparent conductor 100, 101, or 102, which has a reduced water vapor transmission rate, as a positive electrode. In addition, the transparent conductors 100, 101, and 102 can be used as negative electrodes of organic devices.

While the suitable embodiments of the present invention have been described hereinbefore, the present invention is not limited to the above-described embodiments. While the above-described transparent conductor 101 includes a pair of the hardcoat layers 20, the transparent conductor 101 may include only one of the first hardcoat layer 22 and the second hardcoat layer 24, for example. The transparent conductor 101 may be patterned in a manner such that a part of the first hardcoat layer 22 is exposed. Alternatively, a configuration may be used in which a hardcoat layer is provided on one surface of the transparent resin substrate 10 and a plurality of optical adjustment layers is provided on the other surface by application. In this case, the first metal oxide layer 12, the metal layer 16, and the second metal oxide layer 14 may be provided above the optical adjustment layers. Further, any layer other than the above-described layers may be provided at any position of the transparent conductor 100, 101, or 102 in a manner such that the function is not largely impaired.

EXAMPLES

Hereinafter, the present invention will be described more specifically with reference to Examples and Comparative Examples; however, the present invention is never limited to the Examples.

Examples 1 to 9, Comparative Examples 1 to 6

(Production of Transparent Conductor)

Transparent conductors as illustrated in FIG. 1 were produced. The transparent conductors each had a laminate structure in which a transparent resin substrate, a first metal oxide layer, a metal layer, and a second metal oxide layer were laminated in the order presented. Each of the transparent conductors of Examples and Comparative Examples was produced in the following manner.

A commercially available polyethylene terephthalate film (thickness: 125 μm) was prepared. The PET film was used as the transparent resin substrate. The first metal oxide layer, the metal layer, and the second metal oxide layer were sequentially formed above the PET film through DC magnetron sputtering. The first metal oxide layer and the second metal oxide layer were formed by using targets having compositions listed in Table 1. Each of the first metal oxide layer and the second metal oxide layer formed had the same composition as the corresponding target. The thickness of each of the first metal oxide layer and the second metal oxide layer in each Example was 40 nm.

In all of Examples shown in Table 1, the metal layer was formed by using an AgPdCu (Ag:Pd:Cu=99.0:0.7:0.3 (% by mass)) target. The thickness of the metal layer 16 was 10 nm.

(Evaluation of Transparent Conductor)

The crystallinity of each of the first metal oxide layer and the second metal oxide layer in each of the transparent conductors of Examples and Comparative Examples was evaluated by using XRD. Specifically, a case that a diffraction peak derived from the (002) plane of ZnO was observed was considered crystalline, and a case that the peak was not observed was considered amorphous. The determination results are shown in the column "Crystallinity" in Table 1. In Table 1, "C" indicates being crystalline and "A" indicates being amorphous.

The total light transmittance (transmittance) of each of the transparent conductors of Examples and Comparative Examples was measured by using a hazemeter (trade name: NDH-7000, manufactured by NIPPON DENSHOKU INDUSTRIES CO., LTD.). The measurement results were as shown in Table 2.

The surface resistance value of each of the transparent conductors of Examples and Comparative Examples was measured by using a four-terminal resistivity meter (trade name: Loresta GP, manufactured by Mitsubishi Chemical Corporation). The results are shown in the column "Resistance value" in Table 2.

The corrosion resistance of each of the transparent conductors of Examples and Comparative Examples was evaluated by using the following procedure. Specifically, each of the transparent conductors of Examples and Comparative Examples was stored under an environment of 60° C. and 90% RH (relative humidity of 90%), or an environment of 85° C. and 85% RH (relative humidity of 85%), for 300 hours. After the storage, the surface of the transparent conductor in the second metal oxide layer side was visually observed. A case that no defect was observed was rated as "A", a case that a few defects were observed was rated as "B", and a case that defects more than those for "B" were observed was rated as "C". The evaluation results after storing under an environment of 60° C. and 90% RH are shown in the column "Corrosion resistance (1)" in Table 2, and the evaluation results after storing under an environment of 85° C. and 85% RH are shown in the column "Corrosion resistance (2)" in Table 2.

The water vapor transmission rate of each of the transparent conductors of Examples and Comparative Examples was evaluated by using the following procedure. The water vapor transmission rate was measured under conditions of 40° C. and 90% RH by using a water vapor transmission rate measurement apparatus by a MOCON method (AQUA-TRAN) manufactured by Hitachi High-Technologies Corporation. The measurement results are shown in Table 2.

For each of the transparent conductors of Examples and Comparative Examples, the solubility in acids for etching was evaluated by using the following procedure. First, a PAN-based etching solution containing phosphoric acid, acetic acid, nitric acid, and hydrochloric acid was prepared. The transparent conductor was soaked in the etching solution at room temperature for 1 minute to perform etching. Thereafter, measurement of total light transmittance was performed to determine whether the second metal oxide layer, the metal layer, and the first metal oxide layer were dissolved. Specifically, a case that the total light transmittance of a sample after the etching was identical to the total light transmittance of the transparent resin substrate was rated as "A", and a case that they were not identical was rated as "B". The evaluation results were as shown in Table 2.

For each of the transparent conductors of Examples and Comparative Examples, the resistance to alkalis was evaluated by using the following procedure. A KOH aqueous solution with a KOH concentration of 3% by mass was prepared. The transparent conductor was soaked in the alkaline solution at room temperature for 2 minutes. Thereafter, measurement of total light transmittance was performed to determine whether the first metal oxide layer, the metal layer, and the second metal oxide layer were dissolved. Specifically, a case that the total light transmittance of a sample after the soaking in the alkaline solution was identical to the total light transmittance before the soaking was rated as "A", and a case that they were not identical was rated as "B". The evaluation results were as shown in Table 2.

Comparative Examples 7 and 9

Transparent conductors were produced in the same manner as in Example 1, except that the first metal oxide layer and the second metal oxide layer were formed by using an ITO target having a composition listed in Table 1, and evaluated. The evaluation results are shown in Table 2. In evaluation of crystallinity, since ZnO was not contained, a case that a diffraction peak derived from the (222) plane of $In_2O_3$ was observed was considered crystalline, and a case that the diffraction peak was not observed was considered amorphous.

Comparative Example 8

A transparent conductor was produced in the same manner as in Example 1, except that the first metal oxide layer and the second metal oxide layer were formed by using an IZO target having a composition listed in Table 1, and evaluated. The evaluation results are shown in Table 2.

TABLE 1

| | First metal oxide layer | | | | | | Second metal oxide layer | | | | | |
|---|---|---|---|---|---|---|---|---|---|---|---|---|
| | Composition (mol %) | | | | | | Composition (mol %) | | | | | |
| | ZnO | $In_2O_3$ | $TiO_2$ | $SnO_2$ | Total | Crystallinity | ZnO | $In_2O_3$ | $TiO_2$ | $SnO_2$ | Total | Crystallinity |
| Example 1 | 44.0 | 26.0 | 11.0 | 19.0 | 100 | A | 21.0 | 28.0 | 13.0 | 38.0 | 100 | A |
| Example 2 | 44.0 | 26.0 | 11.0 | 19.0 | 100 | A | 44.0 | 26.0 | 11.0 | 19.0 | 100 | A |
| Example 3 | 44.0 | 26.0 | 11.0 | 19.0 | 100 | A | 41.0 | 30.0 | 13.0 | 16.0 | 100 | A |
| Comparative Example 1 | 44.0 | 26.0 | 11.0 | 19.0 | 100 | A | 55.0 | 0.0 | 0.0 | 45.0 | 100 | A |
| Comparative Example 2 | 44.0 | 26.0 | 11.0 | 19.0 | 100 | A | 16.0 | 28.0 | 12.0 | 44.0 | 100 | A |
| Comparative Example 3 | 44.0 | 26.0 | 11.0 | 19.0 | 100 | A | 52.0 | 25.0 | 12.0 | 11.0 | 100 | A |
| Comparative Example 4 | 44.0 | 26.0 | 11.0 | 19.0 | 100 | A | 77.0 | 14.0 | 9.0 | 0.0 | 100 | A |
| Example 4 | 21.0 | 28.0 | 13.0 | 38.0 | 100 | A | 44.0 | 26.0 | 11.0 | 19.0 | 100 | A |
| Example 5 | 44.0 | 26.0 | 11.0 | 19.0 | 100 | A | 44.0 | 26.0 | 11.0 | 19.0 | 100 | A |

TABLE 1-continued

| | First metal oxide layer | | | | | | Second metal oxide layer | | | | | |
|---|---|---|---|---|---|---|---|---|---|---|---|---|
| | Composition (mol %) | | | | | | Composition (mol %) | | | | | |
| | ZnO | In$_2$O$_3$ | TiO$_2$ | SnO$_2$ | Total | Crystallinity | ZnO | In$_2$O$_3$ | TiO$_2$ | SnO$_2$ | Total | Crystallinity |
| Example 6 | 41.0 | 30.0 | 13.0 | 16.0 | 100 | A | 44.0 | 26.0 | 11.0 | 19.0 | 100 | A |
| Example 7 | 52.0 | 25.0 | 12.0 | 11.0 | 100 | A | 44.0 | 26.0 | 11.0 | 19.0 | 100 | A |
| Example 8 | 72.0 | 13.0 | 10.0 | 5.0 | 100 | A | 44.0 | 26.0 | 11.0 | 19.0 | 100 | A |
| Example 9 | 77.0 | 14.0 | 9.0 | 0.0 | 100 | A | 44.0 | 26.0 | 11.0 | 19.0 | 100 | A |
| Comparative Example 5 | 55.0 | 0.0 | 0.0 | 45.0 | 100 | A | 44.0 | 26.0 | 11.0 | 19.0 | 100 | A |
| Comparative Example 6 | 16.0 | 28.0 | 12.0 | 44.0 | 100 | A | 44.0 | 26.0 | 11.0 | 19.0 | 100 | A |
| Comparative Example 7 | In$_2$O$_3$:SnO$_2$ = 92:8 | | | | | C | In$_2$O$_3$:SnO$_2$ = 92:8 | | | | | C |
| Comparative Example 8 | In$_2$O$_3$:ZnO = 90:10 | | | | | C | In$_2$O$_3$:ZnO = 90:10 | | | | | C |
| Comparative Example 9 | In$_2$O$_3$:SnO$_2$ = 92:8 | | | | | C | In$_2$O$_3$:SnO$_2$ = 92:8 | | | | | C |

TABLE 2

| | Evaluation results | | | | | | |
|---|---|---|---|---|---|---|---|
| | Total light transmittance (%) | Resistance value (Ω/sq.) | Corrosion resistance (1) | Corrosion resistance (2) | Water vapor transmission rate (g/m$^2$/day) | Etching | Resistance to alkalis |
| Example 1 | 89 | 8.8 | A | B | $\leq 5 \times 10^{-4}$ | A | A |
| Example 2 | 89 | 9.0 | A | B | $\leq 5 \times 10^{-4}$ | A | A |
| Example 3 | 89 | 8.9 | A | B | $\leq 5 \times 10^{-4}$ | A | A |
| Comparative Example 1 | 88 | 8.8 | C | C | $\leq 5 \times 10^{-4}$ | B | A |
| Comparative Example 2 | 83 | 8.7 | C | C | $\leq 5 \times 10^{-4}$ | A | A |
| Comparative Example 3 | 89 | unmeasurable | A | B | $\leq 5 \times 10^{-4}$ | A | A |
| Comparative Example 4 | 89 | unmeasurable | A | A | $\leq 5 \times 10^{-4}$ | A | A |
| Example 4 | 88 | 8.7 | A | B | $\leq 5 \times 10^{-4}$ | A | A |
| Example 5 | 89 | 8.8 | A | B | $\leq 5 \times 10^{-4}$ | A | A |
| Example 6 | 89 | 8.9 | A | B | $\leq 5 \times 10^{-4}$ | A | A |
| Example 7 | 88 | 8.9 | A | B | $\leq 5 \times 10^{-4}$ | A | A |
| Example 8 | 89 | 8.8 | A | A | $\leq 5 \times 10^{-4}$ | A | A |
| Example 9 | 89 | 8.7 | A | A | $\leq 5 \times 10^{-4}$ | A | A |
| Comparative Example 5 | 89 | 8.8 | C | C | $\leq 5 \times 10^{-4}$ | A | A |
| Comparative Example 6 | 82 | 8.9 | C | C | $\leq 5 \times 10^{-4}$ | A | A |
| Comparative Example 7 | 86 | 9.1 | C | C | $4 \times 10^{-1}$ | B | A |
| Comparative Example 8 | 83 | 8.9 | A | B | $4 \times 10^{-3}$ | B | A |
| Comparative Example 9 | 90 | 9.0 | C | C | $4 \times 10^{-1}$ | B | A |

As shown in Table 2, the total light transmittance was 85% or higher, the resistance value was 9 Ω/sq. or lower, and the corrosion resistance was rated as A or B for all of Examples. This result confirmed that the transparent conductor of each Example has excellent transparency and excellent conductivity in combination, and is excellent in corrosion resistance under a high temperature and high humidity environment. In addition, the etching (solubility in acids) and resistance to alkalis were rated as "A" for all of Examples. That is, it was confirmed that the second metal oxide layer, the metal layer, and the first metal oxide layer of the transparent conductor of each Example can be removed by etching in a single operation. It was confirmed that the transparent conductor of each Example has excellent resistance to alkalis.

For Comparative Examples 1 to 6, in contrast, at least one of transparency, corrosion resistance, and conductivity was insufficient. For Comparative Examples 3 and 4, the resistance value was 30 Ω/sq. or higher, and unmeasurable. While the water vapor transmission rate was lower than the lower limit of measurement ($5 \times 10^{-4}$ g/m$^2$/day) for Examples 1 to 9 and Comparative Examples 1 to 6, the water vapor transmission rate was significantly high for Comparative Examples 7 to 9. The configuration in which the first metal oxide layer and the second metal oxide layer were not amorphous but crystalline is expected to be one of the causes.

Example 10

A transparent conductor was produced in the same manner as in Example 5, except that AgPdCu [Ag:Pd:Cu=98.2:1.5:0.3 (based on mass)] was used as a target for formation of the metal layer, and evaluated. The evaluation results are shown in Table 3.

Example 11

A transparent conductor was produced in the same manner as in Example 5, except that AgNdCu [Ag:Nd:Cu=99.0:0.5:0.5 (based on mass)] was used as a target for formation of the metal layer, and evaluated. The evaluation results are shown in Table 3.

Example 12

A transparent conductor was produced in the same manner as in Example 5, except that AgCu [Ag:Cu=99.5:0.5: (based on mass)] was used as a target for formation of the metal layer, and evaluated. The evaluation results are shown in Table 3.

Example 13

A transparent conductor was produced in the same manner as in Example 5, except that an AgSnSb alloy [Ag:Sn:Sb=99.0:0.5:0.5 (based on mass)] was used as a target for formation of the metal layer, and evaluated. The evaluation results are shown in Table 3.

TABLE 3

| | | Evaluation results | | | | | |
|---|---|---|---|---|---|---|---|
| | Silver alloy | Total light transmittance (%) | Resistance value ($\Omega$/sq.) | Corrosion resistance (1) | Corrosion resistance (2) | Etching | Resistance to alkalis |
| Example 10 | AgPdCu | 87 | 8.6 | A | A | A | A |
| Example 11 | AgNdCu | 88 | 8.7 | A | B | A | A |
| Example 12 | AgCu | 90 | 8.8 | A | B | A | A |
| Example 13 | AgSnSb | 88 | 8.9 | A | B | A | A |

As shown in Table 3, the transparent conductor of Example 10, which included a metal layer composed of an AgPdCu alloy, had the most excellent corrosion resistance. The reason why the corrosion resistance for Example 10 was more excellent than that for Example 5 in Table 2 is presumably that the content of Pd in the silver alloy was higher for Example 10. The transparent conductor of Example 12, which included a metal layer composed of an AgCu alloy, had the highest total light transmittance.

Examples 14 to 19

Transparent conductors were produced in the same manner as in Example 8, except that the thickness of the metal layer was changed as shown in Table 4, and evaluated. The evaluation results are shown in Table 4. In Table 4, the evaluation data for Example 8 are also shown for comparison.

TABLE 4

| | Thickness of metal layer nm | Total light transmittance (%) | Resistance value ($\Omega$/sq.) | Water vapor transmission rate (g/m$^2$/day) |
|---|---|---|---|---|
| Example 14 | 3 | 82 | 65 | $9 \times 10^{-3}$ |
| Example 15 | 4 | 85 | 31 | $\leq 5 \times 10^{-4}$ |
| Example 16 | 5 | 87 | 24 | $\leq 5 \times 10^{-4}$ |
| Example 8 | 10 | 89 | 8.8 | $\leq 5 \times 10^{-4}$ |
| Example 17 | 15 | 87 | 4.6 | $\leq 5 \times 10^{-4}$ |
| Example 18 | 18 | 85 | 2.1 | $\leq 5 \times 10^{-4}$ |
| Example 19 | 20 | 75 | 1.5 | $\leq 5 \times 10^{-4}$ |

As shown in Table 4, no significant reduction of the water vapor transmission rate was found even when the thickness of the metal layer was set smaller. It was confirmed that the total light transmittance tends to be lower when the thickness of the metal layer is excessively small or excessively large. However, the total light transmittance is kept sufficiently high by the configuration in which the first metal oxide layer, the second metal oxide layer, and the metal layer have the compositions according to the present invention.

INDUSTRIAL APPLICABILITY

The present disclosure provides a transparent conductor having excellent transparency and excellent conductivity in combination, and being excellent in corrosion resistance under a high temperature and high humidity environment.

REFERENCE SIGNS LIST

10: transparent resin substrate, 12: first metal oxide layer, 14: second metal oxide layer, 16: metal layer, 20: hardcoat layer, 22: first hardcoat layer, 24: second hardcoat layer, 30: nonconductive part, 40: conductive part, 100, 101, 102: transparent conductor

The invention claimed is:
1. A transparent conductor comprising:
a transparent resin substrate, a first metal oxide layer, a metal layer containing a silver alloy, and a second metal oxide layer in the order presented,
wherein the first metal oxide layer contains zinc oxide, indium oxide, and titanium oxide, and a content of SnO$_2$ in the first metal oxide layer is 40 mol % or less with respect to a total of four components of zinc oxide, indium oxide, titanium oxide, and tin oxide in terms of ZnO, In$_2$O$_3$, TiO$_2$, and SnO$_2$, respectively,
wherein the second metal oxide layer contains zinc oxide, indium oxide, titanium oxide, and tin oxide, and a content of SnO$_2$ in the second metal oxide layer is 12 to 40 mol % with respect to a total of the four components in terms of ZnO, In$_2$O$_3$, TiO$_2$, and SnO$_2$, respectively, and wherein at least one of the first metal oxide layer and the second metal oxide layer is amorphous.

2. The transparent conductor according to claim 1, wherein, in the second metal oxide layer, a content of ZnO is 20 to 50 mol %, a content of $In_2O_3$ is 20 to 35 mol %, and a content of $TiO_2$ is 10 to 15 mol %, with respect to the total of the four components.

3. The transparent conductor according to claim 2, wherein, in the first metal oxide layer, a content of ZnO is 20 to 80 mol %, a content of $In_2O_3$ is 10 to 35 mol %, and a content of $TiO_2$ is 5 to 15 mol %, with respect to the total of the four components.

4. The transparent conductor according to claim 2, wherein, in the first metal oxide layer, a content of $SnO_2$ is 5 mol % or less with respect to the total of the four components.

5. The transparent conductor according to claim 2, wherein the silver alloy contains Ag, Pd, and Cu as constituent elements.

6. The transparent conductor according to claim 1, wherein, in the first metal oxide layer, a content of ZnO is 20 to 80 mol %, a content of $In_2O_3$ is 10 to 35 mol %, and a content of $TiO_2$ is 5 to 15 mol %, with respect to the total of the four components.

7. The transparent conductor according to claim 6, wherein, in the first metal oxide layer, a content of $SnO_2$ is 5 mol % or less with respect to the total of the four components.

8. The transparent conductor according to claim 6, wherein the silver alloy contains Ag, Pd, and Cu as constituent elements.

9. The transparent conductor according to claim 1, wherein, in the first metal oxide layer, a content of $SnO_2$ is 5 mol % or less with respect to the total of the four components.

10. The transparent conductor according to claim 9, wherein the silver alloy contains Ag, Pd, and Cu as constituent elements.

11. The transparent conductor according to claim 1, wherein the silver alloy contains Ag, Pd, and Cu as constituent elements.

* * * * *